United States Patent [19]

Iwamoto et al.

[11] Patent Number: 5,128,975
[45] Date of Patent: Jul. 7, 1992

[54] X-RAY EXPOSURE SYSTEM

[75] Inventors: Kazunori Iwamoto, Atsugi; Shunichi Uzawa, Tokyo; Takao Kariya, Hino; Ryuichi Ebinuma, Kawasaki, all of Japan

[73] Assignee: Canon Kabushiki Kaisha, Tokyo, Japan

[21] Appl. No.: 641,332

[22] Filed: Jan. 15, 1991

Related U.S. Application Data

[63] Continuation of Ser. No. 417,187, Oct. 4, 1989, abandoned.

[30] Foreign Application Priority Data

Oct. 5, 1988 [JP] Japan ................... 63-252761

[51] Int. Cl.$^5$ ............................................. G21K 5/00
[52] U.S. Cl. .................................... 378/34; 378/35; 378/160; 378/208; 378/119; 250/491.1; 250/492.2
[58] Field of Search ............ 378/34, 35, 208, 210, 378/119, 160; 250/491.1, 306, 492.2

[56] References Cited

U.S. PATENT DOCUMENTS

| 4,631,743 | 12/1986 | Tomimasu et al. | 378/119 |
| 4,748,646 | 5/1988 | Osada et al. | 378/34 |
| 4,803,712 | 2/1989 | Kembo et al. | 378/34 |
| 4,803,713 | 2/1989 | Fujii | 378/34 |
| 4,856,037 | 8/1989 | Mueller et al. | 378/34 |
| 4,887,283 | 12/1989 | Hosono | 378/35 |
| 4,979,195 | 12/1990 | Tabata et al. | 378/34 |
| 5,001,734 | 3/1991 | Uda et al. | 378/34 |

FOREIGN PATENT DOCUMENTS 0027195 4/1981 European Pat. Off. .

OTHER PUBLICATIONS

Thompson, et al., "A Synchrotron Compatible Production Oriented X-ray Stepper," Microelectronic Engineering, vol. 6, Nos. 1 through 4, Dec. 1987.

Primary Examiner—Janice A. Howell
Assistant Examiner—Kim-Kowk Chu
Attorney, Agent, or Firm—Fitzpatrick, Cella, Harper & Scinto

[57] ABSTRACT

An X-ray exposure system for exposing a semiconductor wafer to a mask with X-rays contained in synchrotron radiation, is disclosed. In this system, the mask and the wafer are held on a main frame so that their surfaces extend substantially parallel to a vertical axis. The main frame suspends from a supporting frame through a plurality of air mounts, each being vertically displaceable. The supporting frame is placed on the same reference surface as that of an SOR ring that produces synchrotron radiation. By using these air mounts, any tilt of the mask and the wafer relative to the irradiation region of the synchrotron radiation, as well as the position of the mask and the wafer in the vertical direction, with respect to the irradiation region, can be controlled and maintained constant. Thus, accurate pattern printing is ensured.

18 Claims, 5 Drawing Sheets

X-RAY EXPOSURE SYSTEM

This application is a continuation of prior application Ser. No. 07/417,187 filed Oct. 4, 1989, now abandoned.

FIELD OF THE INVENTION AND RELATED ART

This invention relates to an X-ray exposure system for use in the manufacture of semiconductor chips and, more particularly, to an X-ray exposure system for exposing a semiconductor wafer to a mask with X-rays contained in synchrotron radiation, to print a pattern of the mask on the wafer.

FIG. 4 shows an example of a known type X-ray exposure apparatus. Denoted in this Figure at 37 is a filament for emitting thermoelectrons 39; at 38 is a pulling electrode for drawing the thermoelectrons 39 to a target 40; at 42 is a vacuum chamber by which the filament 37 and the target 40 are kept in a vacuum ambience; and at 43 is a beryllium window which functions as a partition for isolating the vacuum ambience in the vacuum chamber 42 from the atmosphere. X-rays 41 from the target 40 pass through the beryllium window 43 into the atmosphere.

Denoted at 44 is a frame for supporting the vacuum chamber 42; at 45 is a mask stage for holding an X-ray mask 1; at 47 is a wafer stage for holding a wafer 46; at 48 is a surface plate which serves as a base for supporting the frame 44, the mask stage 45 and the wafer stage 47; and at 49 is an air spring means provided for vibration isolation of the surface plate 48.

The air spring means 49 is effective to suppress the natural vibration frequency of the exposure apparatus as a whole, structured on the surface plate 48, on order of a few Hertz and to render the apparatus as a whole insensitive to high-frequency external vibration. Also, in this apparatus, the entire structure is placed on the surface plate 48, and the relative position of the mask 1 and the illumination area by the X-rays 41 is determined unconditionally.

Then, in the illustrated state, the X-rays 41 are projected on the mask 1 and then on the wafer 46, whereby a pattern of the mask 1 is printed on the wafer 46.

Another example is an X-ray exposure system having, as an X-ray source, a synchrotron orbit radiation (SOR) ring adapted to produce synchrotron radiation. In this type of exposure system, an SOR ring (X-ray source) is disposed, not on a surface plate such as at 48 in FIG. 4, but on a floor (ground), separately from the surface plate.

In an exposure system of the type using synchrotron radiation, in which an illumination system having an exposure energy source is disposed on a floor or otherwise, separately from a stage system for holding a mask and a wafer, there is a possibility of a change in orientation of the mask or the wafer relative to the exposure energy supplied from the illumination system. Therefore, the vibration isolation of the surface plate, such as that made to the surface plate 48 in FIG. 4, is not sufficient to ensure that the pattern of the mask is printed on the wafer without any pattern superposing error. Namely, it is necessary to continuously maintain the attitude of the stage system constant.

The attitude of a stage system may be maintained constant, in the FIG. 4 example, by controlling the attitude of the mask 1 and the wafer 46 (lying substantially horizontally) by using the air spring means 49.

However, this method cannot be directly applied to an X-ray exposure system using synchrotron radiation. This is because of the fact that the synchrotron radiation is emitted approximately horizontally from the SOR ring and that it is very difficult to change the direction of advancement to a vertical direction as in the FIG. 4 example.

Referring to FIG. 5, a possible pattern superposing error in an X-ray exposure system having an SOR ring as a light source, will be explained. Denoted in FIG. 5 at 50 is a point of radiation emission of the SOR ring (or a point of reflection on an X-ray reflecting mirror for reflecting the synchrotron radiation from the SOR ring); at A is the distance from the emission point 50 to a mask 1; at B is the view angle for exposure (X-ray illumination area); at C is the proximity gap between the mask 1 and a wafer 46; at $\epsilon w_x$ is the quantity of pattern superposing error which occurs when, in a state where there is no relative displacement between the mask 1 and the wafer 46, the mask and the wafer are inclined by $\Delta w_x$ from a plane which is perpendicular to the axis of the synchrotron radiation beam; and "$\epsilon 1 - \epsilon 2$" represents the quantity of pattern superposing error which occurs when, in a state where there is no relative displacement between the mask 1 and the wafer 46, both the mask and the wafer are shifted by $\Delta y$ from the axis of the synchrotron radiation beam.

Assuming in FIG. 5 that:
A = 4500 (mm)
B = 30 (mm)
C = 0.05 (mm)
$\Delta y = 1$ (mm)
$\Delta w_x = 5 \times 10^{-4}$ (rad)

then the pattern transfer error (superposing error) $\epsilon y$ ($= \epsilon 1 - \epsilon 2$) resulting from the shift $\Delta y$ can be expressed as follows:

$$\begin{aligned}
\epsilon y &= C \times [\beta/2/A - (\beta/2 - \Delta y)/A] \\
&= C \times \Delta y/A \\
&= 0.05 \times 1/4500 \\
&= 1.1 \times 10^{-5} \text{ (mm)} \\
&= 0.011 \text{ } (\mu m)
\end{aligned}$$

On the other hand, the pattern transfer error (superposing error) $\epsilon w_x$ resulting from the inclination $\Delta w_x$ can be expressed as follows:

$$\begin{aligned}
\epsilon w_x &= C \times \Delta w_x \\
&= 0.05 \times 5 \times 10^{-4} \\
&= 2.5 \times 10^{-5} \text{ (mm)} \\
&= 0.025 \text{ } (\mu m)
\end{aligned}$$

It is accordingly an object of the present invention to provide an X-ray exposure system by which the attitude and position of a mask and a wafer relative to a synchrotron radiation beam can be retained at high precision and, as a result, precise pattern printing is ensured.

In accordance with an aspect of the present invention, to achieve this object, there is provided an exposure system for exposing a wafer to a mask with X-rays contained in sychrotron radiation to print a pattern of the mask on the wafer, wherein the mask and the wafer are supported by a frame member so that their surfaces are disposed substantially parallel to a vertical direction, wherein the frame member is supported by means of a plurality of vibro-isolating mechanisms so that the former can be displaced relative to the surface of a floor on which the vibro-isolating mechanisms are supported, and wherein these vibro-isolating mechanisms can be controlled and actuated independently of each other, whereby the attitude of the mask and the wafer with respect to the synchrotron radiation beam as well as the position of the frame memh=, with respect to the radiation beam, can be maintained substantially constant.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

In an exposure apparatus for use in the manufacture of semiconductor chips, usually an overall pattern superposition precision on an order of a fraction of a linewidth is required. The pattern superposition precision may be degraded due to various factors, examples of which are distortion in the apparatus itself, process distortion of a mask related to the preparation thereof, process distortion of a wafer caused by a process other than the exposure process, alignment precision, distortion by an illumination system, and the like. Thus, the pattern transfer error described hereinbefore is only one of the distortion factors provided by the illumination system. In consideration of this, on an occasion when a pattern of a linewidth of 0.25 micron order is to be printed by using a synchrotron radiation beam, the above described transfer errors $\epsilon y$ and $\epsilon w_x$ are each of a large quantity. Therefore, an overall pattern superposition precision on an order of a fraction of the linewidth is difficult to achieve, unless the order of the transfer errors is reduced by one factor.

Further, to assure printing of a pattern of a linewidth of 0.25 micron order, it is important to make the quantity of exposure uniform throughout the exposure area to thereby ensure uniformness in linewidth in the exposure area.

Figure 5:
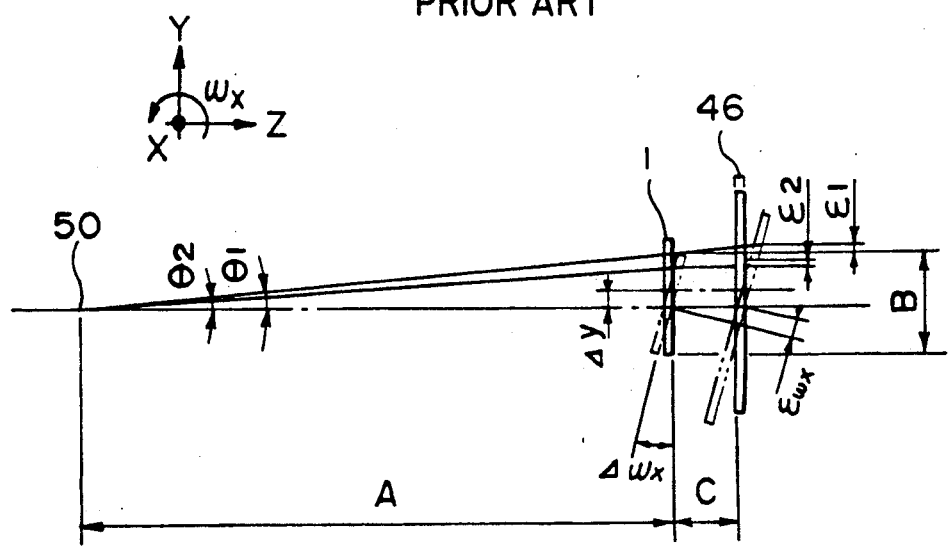
FIG. 5 is a schematic representation, illustrating pattern superposing errors which may occur in an X-ray exposure system using a synchrotron radiation beam.

As is well known in the art, the synchrotron radiation from an SOR ring is in the form of a sheet beam having a uniform intensity with respect to a horizontal direction, but having an intensity distribution of Gaussian function shape with respect to a vertical direction. For this reason, in order to accomplish irradiation of a desired angle of view with X-rays in an X-ray exposure system having an SOR ring as a light source, it is necessary, as an example, to make the distance A in FIG. 5 not shorter than 100 m. As a result, the efficiency of energy utilization decreases extraordinarily. As another method of uniform irradiation, a mask and a wafer may be scanned in the vertical direction with the synchrotron radiation beam. With this method, however, the scanning speed cannot practically be made so high (at the best, it would be on an order of a few Hertz) and, as a consequence, a possibility of a change in the temperature distribution within the exposure area arises during the exposure. Accordingly, there arises a problem of thermal distortion of the mask or wafer, which cannot be disregarded.

Figure 6:
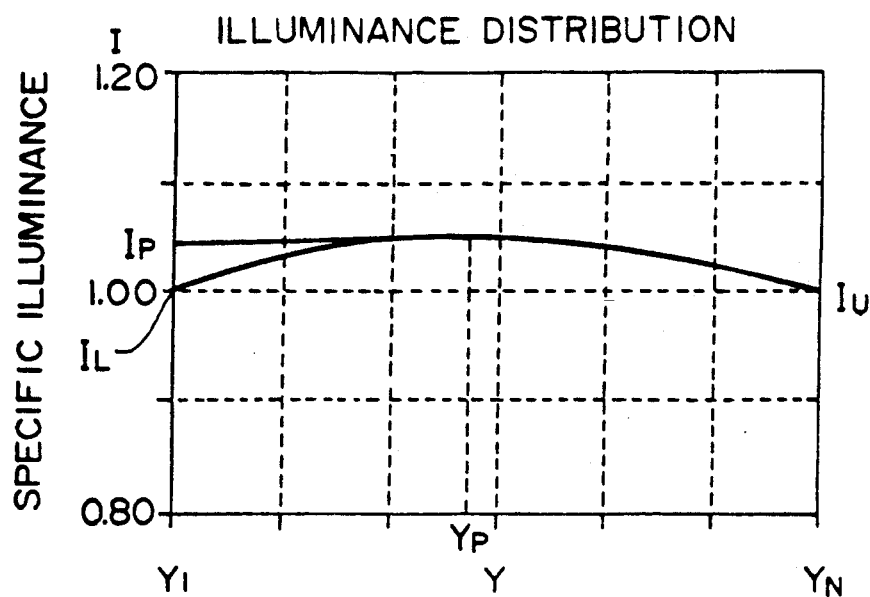
FIG. 6 is a graph showing an example of an illuminance distribution in a vertical direction, as can be provided by synchrotron radiation.

In an X-ray exposure system using an SOR ring as a light source, therefore, it will be necessary to use an X-ray mirror or otherwise to expand a synchrotron radiation beam from the SOR ring in the vertical direction to allow the entire illumination area (view angle for exposure) to be illuminated at the same moment. However, manufacture of such an X-ray mirror having an aspherical surface shape is not easy. Also, it is not easy to make the illuminance distribution in the vertical direction completely uniform by expanding the synchrotron radiation beam in the vertical direction, by using a mirror means. When a cylindrical mirror whose reflection surface has a single curvature is used to expand the synchrotron radiation in the vertical direction (direction Y in FIG. 6), in the exposure area (view angle) there is produced an illuminance distribution such as illustrated in FIG. 6, wherein it is seen that in the vertical direction (Y direction) one peak is present.

Figure 7:
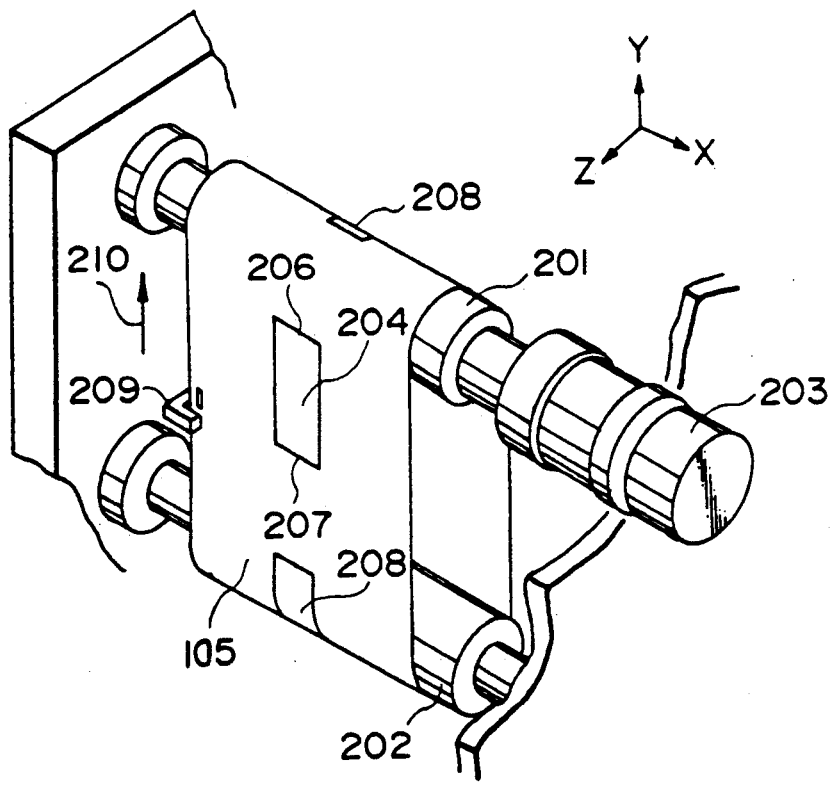
FIG. 7 is a fragmentary perspective view, showing a shutter device used in the X-ray exposure system of the FIG. 1 embodiment.

In order to compensate for such non-uniformness in illuminance along the vertical direction, within the illumination region, to thereby ensure uniformness in linewidth of a printed pattern, a shutter device, such as shown in FIG. 7, may be used.

As illustrated in FIG. 7, the shutter device includes a rotationally movable belt member 105 having two rectangular openings 204 and 208. The belt member 105 is provided by a thin metal belt made of stainless steel, for example, and has a sufficient thickness for blocking X-rays from a light source.

The belt 105 is wound around rollers 201 and 202 and is rotationally moved by means of a drive motor 203, such that the openings of the belt 105 can serve as a movable aperture means. The moving direction of the apertures corresponds to the direction in which non-uniformness in illumination takes place. The belt 105 has its openings formed at two sites, and the opening 204 is operable as a movable aperture means for locally controlling the exposure time at each zone in the exposure area (view angle). The opening 204 has a leading edge 206 and a trailing edge 207 and their moving speeds, as they pass through the exposure area are controlled. On the other hand, the opening 208 has an aperture size necessary for avoiding interception of illumination light during a period in which the opening 204 is operating as an exposure shutter means.

Photosensor 209 detects the position of the opening 204 and serves to determine the timing of passage of the opening 204 through the exposure area. Arrow 210 depicts the direction of movement of the belt member.

When a shutter device such as described above is used to make uniform the amount of exposure in the exposure area, if there is a positional error Δy between the center of the synchrotron radiation beam and the position of the shutter device with respect to the vertical direction (Y direction), such an error results in non-uniformness in the amount of exposure. It is to be noted that, from the requirements with regard to the uniformness in linewidth of a pattern over the whole exposure area (view angle), only a very small tolerance on an order of 10 microns or less is allowed for such positional error Δy. However, such a problem can also be solved by the present invention.

Figure 1:
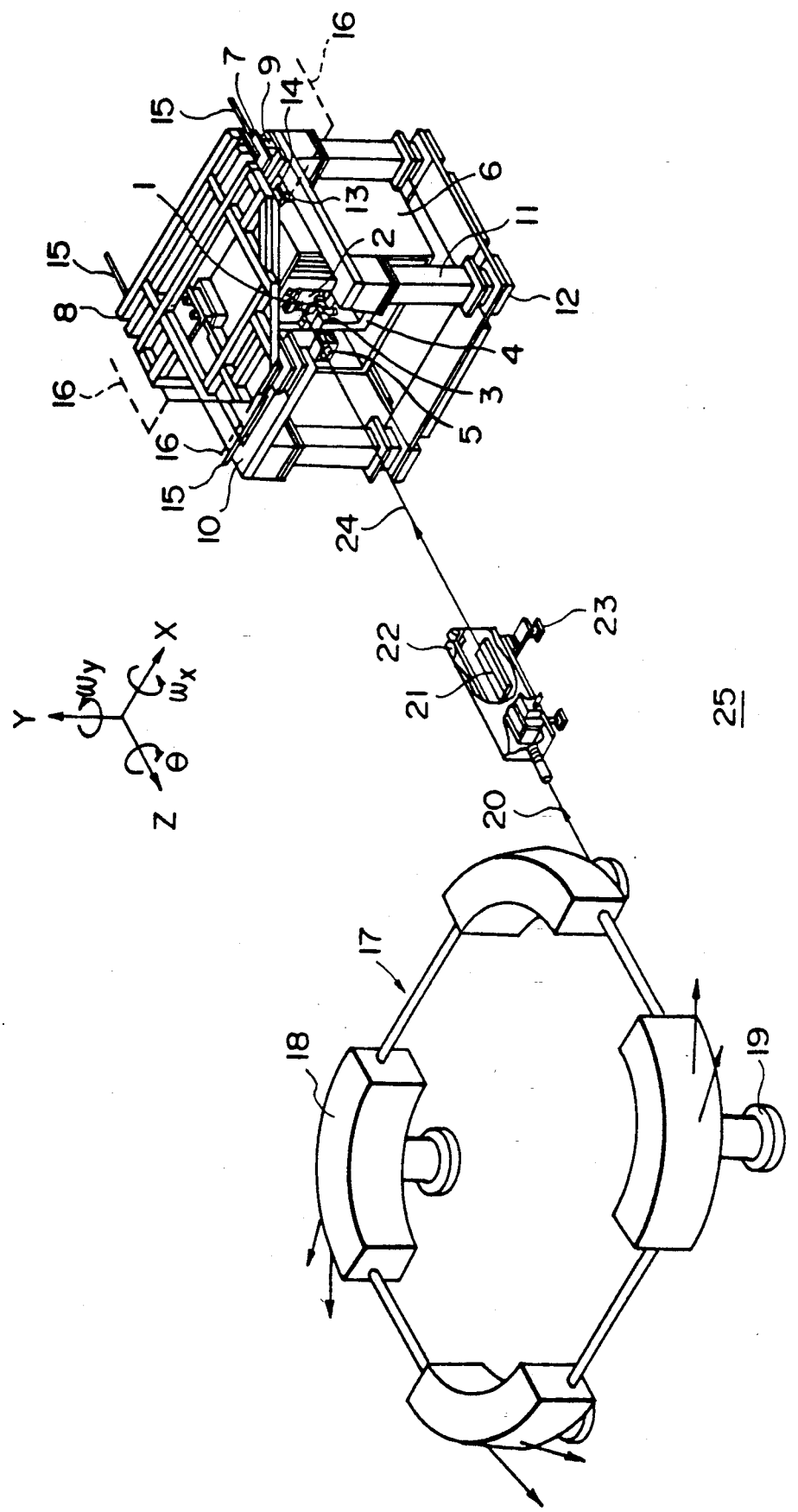
FIG. 1 is a perspective view, schematically showing an X-ray exposure system according to an embodiment of the present invention.
Figure 4:
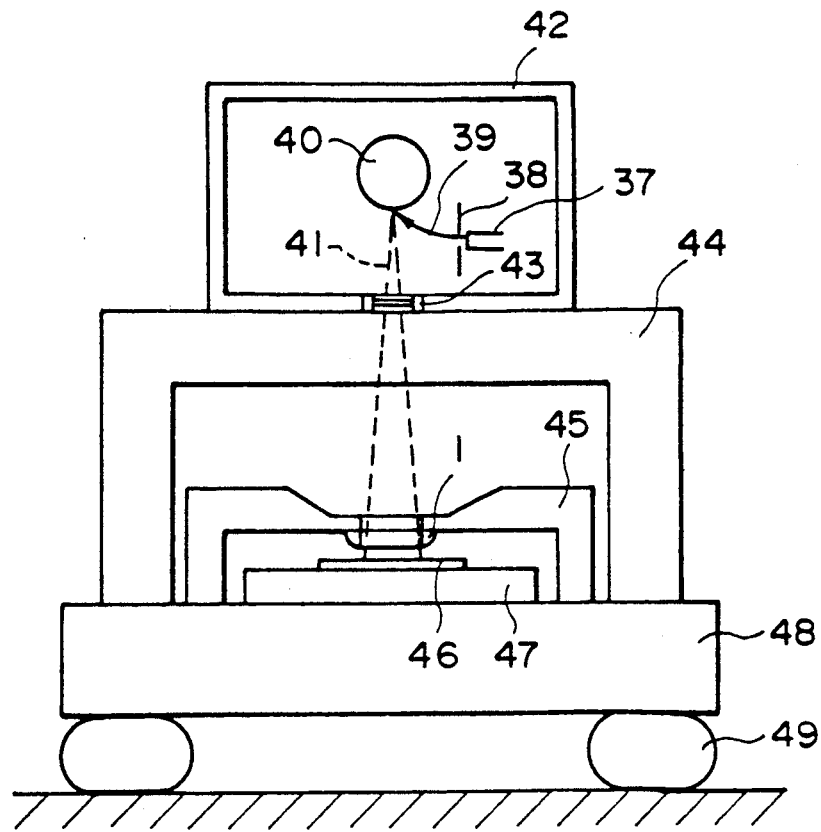
FIG. 4 is a schematic view showing an example of a known type X-ray exposure system.

Referring now to FIG. 1, there is shown an X-ray exposure system according to a first embodiment of the present invention. Denoted at 1 is an X-ray mask on which a fine pattern is formed, and at 2 is an alignment unit which is provided for aligning a wafer (not shown) with the X-ray mask 1. The X-ray mask 1 and the wafer are held by an unshown mask stage and an unshown wafer stage, respectively, so that their surfaces extend substantially parallel to an X-Y plane. Like the FIG. 4 example, the mask 1 and the wafer are disposed opposed to each other with a predetermined gap maintained therebetween. In this embodiment, an X-Y-Z coordinate system is defined as illustrated, wherein the X and Z axes lie substantially in a horizontal plane, while the Y axis extends substantially vertically. Also, the Z axis is set parallel to the direction in which a synchrotron radiation beam is projected to the mask 1. Characters ωx, ωy and θ denote the rotational components about the X, Y and Z axes, respectively.

The unshown wafer stage for supporting the wafer is movable in each of the X, Y and θ directions for correction of any relative positional error between the mask and the wafer as detected by the alignment unit 2, and also, it is movable stepwise in the X and Y directions to allow exposure of each portion of the wafer to the pattern of the mask 1.

Denoted at 3 is a prealignment scope provided for prealignment of the wafer; at 4 is a main frame to which the alignment unit 2, the mask stage, the wafer stage and the like are mounted; at 5 is a secondary chamber which is equipped with a beryllium window and an illuminance distribution correction unit (i.e. the shutter device unit shown in FIG. 7) for correcting the illuminance distribution of the synchrotron radiation; and at 6 is a main chamber effective to provide a desired reduced pressure ambience around the main frame 4, suited to the exposure with X-rays contained in the synchrotron radiation. The main frame 4 and the secondary chamber 5 are coupled to the main chamber 6. The beryllium window of the secondary chamber 5 functions as a partition between the main chamber 6 and a super vacuum beam line along which the synchrotron radiation passes.

Denoted at 7 is a vibro-isolating unit which includes an air spring means as a main constituent element. Although only one vibro-isolating unit is illustrated in FIG. 1, actually the exposure system is provided with three vibro-isolating units which are disposed equidistantly along the X-Z plane. Denoted at 8 is a vibro-isolating base through which the main chamber 6 rides on the vibro-isolating units 7. Denoted at 9 is a leveling block provided for leveling adjustment of the vibro-isolating base 8. Denoted at 10 is a supporting frame for supporting the vibro-isolating units 7. The main chamber 6 suspends from the vibro-isolating base 8. The three vibro-isolating units 7 can be controlled independently of each other by means of a control circuit shown in FIG. 2, and are adapted to support the vibro-isolating base 8 for displacement in the Y-axis direction relative to the supporting frame 10.

Denoted at 11 are a plurality of hydraulic cylinder units each being provided in association with a corresponding one of four pillars which are constituent elements of the supporting frame 10. The cylinder units are operable to adjust the height, in the Y-axis direction, of the apparatus as a whole that includes the main chamber 6. Denoted at 12 is an air bearing means provided at the bottom of the supporting frame 10, for conveyance of the structure. Denoted at 13 are a plurality of displacement gauges provided on the frame 10, for measuring in a non-contact manner, any relative displacement between the frame 10 and the vibro-isolating base 8 in the Y-axis direction, in cooperation with a target 14 which is provided on the vibro-isolating base 8. In this embodiment, three displacement gauges 13 are provided, each being disposed in the neighborhood of a corresponding one of the vibro-isolating units 7, to be associated therewith. Denoted at 15 are pneumatic pressure circuits each being adapted to supply air pressure to a corresponding one of the vibro-isolating units 7. Denoted at 16 are signal lines each being connected to a corresponding one of the displacement gauges 13.

Denoted at 17 is an accumulation ring (SOR ring) for accumulating electrons injected thereinto from an accelerator (not shown); at 18 is a bending magnet; at 19 is an SOR supporting frame for supporting the SOR ring 18; at 20 is a synchrotron radiation beam emanating from the SOR ring 17; at 21 is an X-ray reflection mirror which is effective to expand the synchrotron radiation beam 20 in the Y-axis direction so that the size in section of the radiation beam corresponds to the view angle for exposure; at 22 is a mirror chamber by which the mirror 21 can be surrounded by a super high vacuum; at 23 is a mirror supporting frame for supporting the X-ray mirror 21; at 24 is a shaped exposure beam which advances in a super high vacuum beam line; and at 25 is a supporting floor on which the supporting frames 10, 19 and 23 are placed.

Figure 2:
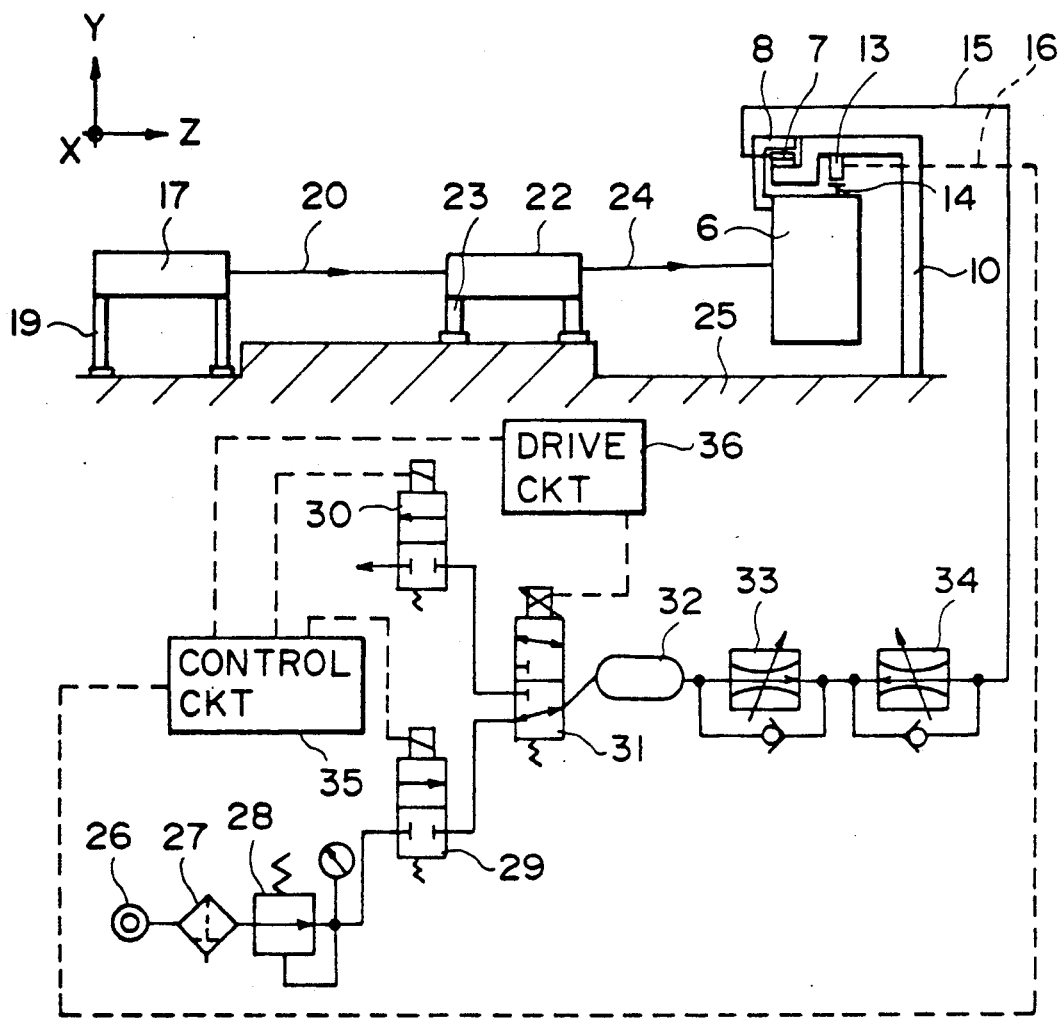
FIG. 2 is a schematic and diagrammatic view, showing an example of a vibro-isolating unit usable in the FIG. 1 embodiment.

FIG. 2 shows details of a control circuit for one of the vibro-isolating units 7. Actually, in this embodiment, three control circuits are provided, each for controlling a corresponding one of the vibro-isolating units 7, such that these vibro-isolating units 7 can operate independently of each other. Denoted in FIG. 2 at 26 is an air pressure source; at 27 is an air filter; at 28 is a regulator; at 29 is an air supplying solenoid valve; at 30 is a discharging solenoid valve; at 31 is an electropneumatic proportioning valve; at 32 is a surge tank for removing any pressure variation; at 33 is an air supplying speed controller; at 34 is an air discharging speed controller; at 35 is a control; and at 36 is a driving circuit.

Next, the operation of the present embodiment will be explained, based on an assumption that, with regard to both the pattern superposition precision and uniformness in linewidth, a relative displacement, if any, between the supporting floor 25 and the SOR ring supporting frame 19, the X-ray mirror supporting frame 23, the vibro-isolating unit supporting frame 10 or the shaped exposure beam 24 is so small that the effect thereof can be disregarded.

The electrons injected from the unshown accelerator are accumulated in the accumulation ring 17, and the orbit of electrons are bent by means of the bending magnet 18 disposed at an arcuate portion of the accumulation ring 17, such that the electrons circulate in the super high vacuum ring. As the orbit of electrons is bent by the bending magnet 18, radiation 20 is emitted along a tangent to the arcuate portion. While the radiation beam 20 is emitted divergently in the X-Z plane which is horizontal along the floor 25, it is restricted with respect to the X-axis direction by means of a pick-up window (not shown) to a required view angle for exposure. On the other hand, with regard to the Y-axis direction which is perpendicular to the floor (ground) 25, the radiation beam 20 has a small divergent angle on an order of 1 mrad. Accordingly, in consideration of the space factor of the whole radiation exposure system and for the wavelength filtering, the X-ray reflection mirror 21 is used to expand the radiation beam 20 in the Y-axis direction to thereby provide an exposure beam 24 shaped to a size of about 30 mm, so as to be suited to the required view angle. The thus provided exposure beam 24 has an illuminance distribution such as, for example, illustrated in FIG. 6.

In the exposure system, on the other hand, the X-ray mask 1 is supported by the vibro-isolating units and through the main frame 4 and the vacuum chamber 6, in a manner that any relative displacement between the vibro-isolating base 8 and the supporting frame 10 in a low frequency region on an order of a few Hertz, can be disregarded. The exposure system is provided with the hydraulic cylinder units 11 and the air bearing means 12 which are operable to set the horizontal and vertical position, in the X-Y plane, of the X-ray mask 1 with respect to the exposure beam 24 as well as the distance of the X-ray mask 1 in the X-axis direction, from the point of radiation emission. The setting of the tilt direction ($w_x$ and $w_y$) with respect to the exposure beam 24 is executed by tilting the vibro-isolating base 8 in the $w_x$ and $w_y$ directions, by vertically moving the three leveling blocks 9 in the Y-axis direction. Such tilt setting is made while holding the vibro-isolating units 7 in a non-operative state, and the leveling is done by subtracting an offset corresponding to the amount of upward displacement of the apparatus which takes place as the vibro-isolating units 7 operate (i.e. the amount of displacement of the vibro-isolating base 8 in the Y-axis direction).

After completion of the initial level setting, the hydraulic cylinder units 11, the air bearing means 12 and the leveling blocks 10 are held fixed so as not to affect the relative displacement between the exposure beam 24 and the X-ray mask 1. Also, in this apparatus, as described hereinbefore, three displacement gauges each having a resolution of 1 micron, are mounted to the fore-part, such as the frame 10, for example, whose relative displacement to the exposure beam 24 can be disregarded. Correspondingly, three detection targets 14 are mounted to the vibro-isolating base 8 or the vacuum chamber 6 whose relative displacement to the X-ray mask 1 can be disregarded.

In FIG. 2, during the exposure sequence the distance between each displacement gauge 13 and a corresponding target 14 in the Y-axis direction is continuously measured by means of that displacement gauge 13. If the measurement exceeds a preset tolerance range, a signal is fed back to a corresponding vibro-isolating unit 7 to bring the Y-axis distance back into the tolerance range and, thereafter, servo-locking is made. The feedback system operates so that, when, for example, a displacement gauge 13 detects expansion of the gap between it and a corresponding target 14 in the Y-axis direction, the control 35 operates in accordance with the result of the detection to close the solenoid valve 30 and also, to open the solenoid valve 29 and, additionally, in a real-time manner the control circuit 35 signals to the driving circuit 36 the amount of opening of the electropneumatic proportioning valve 31, in accordance with the quantity of detected change in gap. In this way, the three vibro-isolating units are actuated in the Y-axis direction, independently of each other, so that the distance in the Y-axis direction between each displacement gauge 13 and a corresponding target 14 comes into the tolerance range. In other words, the feedback system operates to maintain, constant, the position of the mask 1 in the Y-axis direction relative to the exposure beam 24 as well as the attitude of the mask 1 with respect to the $w_x$ and $w_y$ directions. The surge tank 32 serves to prevent a searching phenomenon of the vibro-isolating units 7, and the speed controllers 33 and 34 are used to set the servo gain of the air supplying and discharging system.

In the embodiment described above, an external reference is defined by the supporting frame 10. However, the SOR supporting frame 19, the X-ray mirror supporting frame 23 or the supporting floor 25 may provide such an external reference. With the possibility of modification of the external reference, the relative displacement detecting means is not limited to the displacement gauge 13. As an example, it may be replaced by an acceleration meter, an interferometer or a collimator, adapted to measure a relative displacement or an angle between two objects spaced by a relatively large distance.

Further, in the foregoing embodiment, means may be provided to measure, two-dimensionally, the position of the exposure beam 24 itself in the X-Y plane.

In the foregoing embodiment, the structure of the apparatus suspends from the vibro-isolating units 7. However, it may be placed on and above the vibro-isolating units 7.

Figure 3:
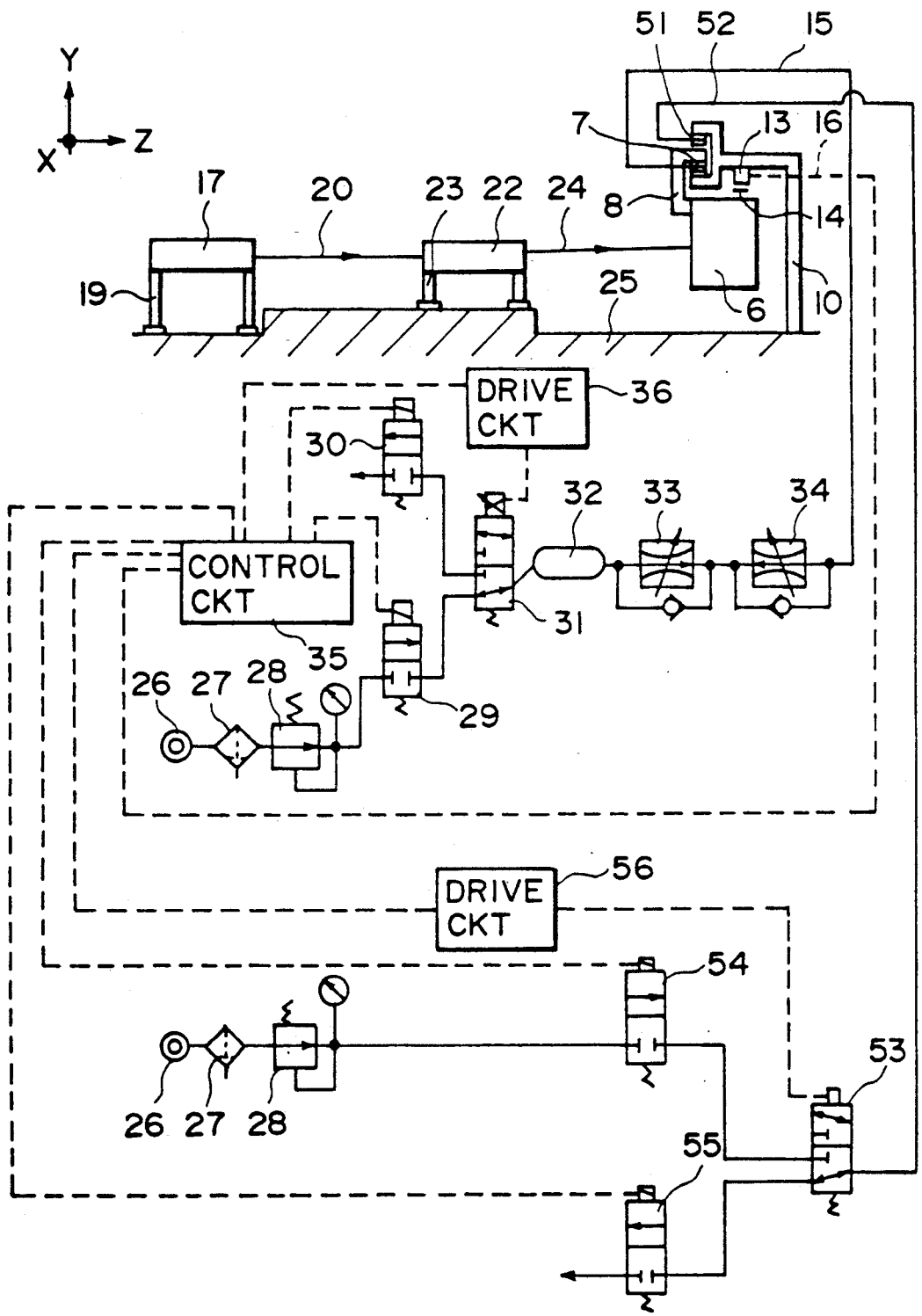
FIG. 3 is a schematic and diagrammatic view, showing another example of a vibro-isolating unit usable in the FIG. 1 embodiment.

FIG. 3 shows another embodiment which corresponds to a modified form of the FIG. 2 embodiment. In the FIG. 3 embodiment, as illustrated, an air spring means 51 is added and disposed at a position opposed to the vibro-isolating base 8 of the FIG. 2 embodiment, with respect to the Y-axis direction. Denoted in FIG. 3 at 52 is a pneumatic pressure circuit for supplying air to the air spring means 51; at 53 is a servo valve (electropneumatic proportioning valve); at 54 is an air supplying solenoid valve; at 55 is an air discharging solenoid valve. The feedback circuit for the vibro-isolating units 7 operates essentially in the same manner as in the foregoing embodiment. However, in this embodiment, when the distance between a displacement gauge 13 and a corresponding target 14 in the Y-axis direction is to be stabilized into a preset tolerance range, for a large relative displacement of an amount of about 1 mm the feedback control is first made to a corresponding vibro-isolating unit 7 to adjust the distance to an order of 0.1 mm and, thereafter, the supplying and discharging solenoid valves 29 and 30 are closed and the discharging solenoid valve 55 is closed while, on the other hand, the supplying solenoid valve 54 is opened. Then, the control circuit 35 signals the driving circuit 56 to change, in a real-time manner, the opening amount of the servo valve 53 with respect to the flow passageway of the air. By this, the distance is adjusted with a 0.01 mm order.

In this embodiment, as compared with the foregoing embodiment, the natural vibration frequency of the vibration-isolated structure is high. However, the present embodiment is superior with regard to the response characteristic. Therefore, there is an advantage in the reduction of time necessary for the adjustment into a preset range.

As described hereinbefore, by adding to a vibration isolating mechanism of an exposure apparatus such correcting means that can correct the attitude of the apparatus with respect to an external reference with a good precision and in a real-time fashion, it is possible to obtain an advantage of improved uniformness in printed linewidth and enhanced overall pattern superposition precision.

While the invention has been described with reference to the structures disclosed herein, it is not confined to the details set forth and this application is intended to cover such modifications or changes as may come within the purposes of the improvements or the scope of the following claims.

What is claimed is:

1. An X-ray exposure system for exposing a wafer to a mask with synchrotron radiation, said system comprising:
   a holding unit for holding the mask and the wafer so that their surfaces extend substantially parallel to a vertical direction;
   a shutter unit provided integrally with said holding unit, for controlling the amount of exposure of the mask and the wafer with the synchrotron radiation;
   a plurality of vibro-isolating units for supporting said holding unit for displacement in a direction substantially parallel to the vertical direction, relative to a floor by which said vibro-isolating units are supported; and
   control means for controlling said vibro-isolating units so as to maintain, substantially constant, the orientation of said holding unit and the position of said holding unit in a direction substantially parallel to the vertical direction.

2. A system according to claim 1, wherein said control means comprises a detector for detcting a change in at least one of the orientation and the position of said holding unit.

3. A system according to claim 1, further comrpising a frame for suspending said holdign unit with said vibro-isolating units arranged therebetween.

4. A system according to claim 3, wherein said control means comprises a detector for detecting a change in at least one of the orientation and the position of said holding unit, relative to said frame.

5. A system according to claim 1, wherein each of said vibro-isolating units comprises air spring means.

6. A system according to claim 1, wherein each of said vibro-isolating units comprises a first spring means for upwardly supporting said holding unit and second air spring means for downwardly supporting said holding unit.

7. An exposure apparatus for exposing a wafer to a mask with a synchrotron radiation beam, said apparatus comprising:
   a support frame for supporting the mask and the wafer so that the surfaces thereof are maintained substantially parallel to a vertical direction;
   a shutter member for controlling the exposure of the wafer with the synchrotron radiation beam;
   a holding member for supporting said support frame and said shutter means;
   a plurality of vibro-isolating support means for supporting said holding member with respect to the vertical direction at respective supporting positions, each of said plurality of vibro-isolating support means being displaceable in the vertical direction at a respective supporting position; and
   control means for independently controlling each fo said plurality of vibro-isolating support means to variably control the orientation and position of said holding member with respect to the vertical direction.

8. An exposure apparatus for exposing a wafer to a mask with synchrotron radiation, said apparatus comprising:
   a holding unit for holding the mask and the wafer;
   a plurality of anti-vibration units for supporting said holding unit at different supporting positions, said anti-vibration units being disposed along a plane substantially parallel to a direction of projection of the synchrotron radiation to the mask and the wafer, and each of the different supporting positions of said holding unit being changeable along a direction substantially perpendicular to the direction of radiation projection by a corresponding one of said plurality of anti-vibration units; and
   control means for controlling said plurality of anti-vibration units to maintain substantially constant at least one of the attitude and the position of said holding unit with respect to the direction substantially perpendicular to the direction of radiation projection.

9. An apparatus according to claim 8, wherein the direction of radiation projection is in a substantially horizontal direction, and wherein each of the different supporting positions of said holding unit is changeable in a substantially vertical direction by a corresponding one of said plurality of anti-vibration units.

10. An apparatus according to claim 9, wherein said control means comprises a detector for detecting a change in at least one of the attitude and the position of said holding unit.

11. An apparatus according to claim 9, further comprising a base, and wherein said holding unit is suspended from said base through said anti-vibration units.

12. An apparatus according to claim 11, wherein said control means comprises a detector for detecting a change in at least one of the attitude and the position of said holding unit with respect to said base.

13. An apparatus according to claim 9, wherein each of said plurality of anti-vibration units comprises first air spring means for supporting said holding unit upwardly, and second air spring means for supporting said holding unit downwardly.

14. An exposure method for manufacture of semiconductor devices, said method comprising the steps of:
   projecting synchrotron radiation to a wafer along a direction of projection to thereby expose the wafer with the radiation;
   holding the wafer by a holding unit which is supported by a plurality of anti-vibration units disposed along a plane substantially parallel to the direction of radiation projection; and
   controlling the plurality of anti-vibration units during said projecting step to maintain substantially constant at least one of the attitude and the position of the holding unit with respect to the direction of radiation projection.

15. A method according to claim 14, wherein the direction of radiation projection is in a substantially horizontal direction, and further comprising displacing the holding unit substantially vertically by the plurality of anti-vibration units.

16. A method according to claim 15, further comprising detecting any change in at least one of the attitude and the position of the holding unit by a detector.

17. A method according to claim 15, further comprising suspending the holding unit from a base through the anti-vibration units.

18. A method according to claim 14, further comprising suspending the holding unit from a base, and detecting any change in at least one of the attitude and the position of the holding unit with respect to the base.

* * * * *

UNITED STATES PATENT AND TRADEMARK OFFICE
CERTIFICATE OF CORRECTION

PATENT NO. : 5,128,975

DATED : July 7, 1992

INVENTOR(S) : Kazunori Iwamoto, et al.

It is certified that error appears in the above-identified patent and that said Letters Patent is hereby corrected as shown below:

COLUMN 3

Line 8, "memh=," should read --member,--; and
Line 55, "above described" should read --above-described--.

COLUMN 5

Line 32, "0" should read --$\theta$--.

COLUMN 6

Line 30, "ring 18;" should read --ring 17,--.

UNITED STATES PATENT AND TRADEMARK OFFICE
CERTIFICATE OF CORRECTION

PATENT NO. : 5,128,975
DATED : July 7, 1992
INVENTOR(S) : Kazunori Iwamoto, et al.

It is certified that error appears in the above-identified patent and that said Letters Patent is hereby corrected as shown below:

COLUMN 9

Line 40, "detcting" should read --detecting--;
Line 43, "comrpising" should read --comprising--; and
Line 44, "holdign" should read --holding--.

COLUMN 10

Line 5, "fo" should read --of--.

Signed and Sealed this

Seventh Day of September, 1993

Attest:

BRUCE LEHMAN

Attesting Officer     Commissioner of Patents and Trademarks